United States Patent

Osaki et al.

Patent Number: 5,288,587
Date of Patent: Feb. 22, 1994

[54] RADIATION-SENSITIVE POSITIVE RESIST COMPOSITION COMPRISING AN O-QUINONE DIAZIDE, AN ALKALI-SOLUBLE RESIN AND A POLYPHENOL COMPOUND

[75] Inventors: Haruyoshi Osaki; Yasunori Uetani, both of Osaka, Japan

[73] Assignee: Sumitomo Chemical Co., Ltd., Osaka, Japan

[21] Appl. No.: 43,151

[22] Filed: Mar. 31, 1993

Related U.S. Application Data

[63] Continuation of Ser. No. 574,112, Aug. 29, 1990, abandoned.

[30] Foreign Application Priority Data

Sep. 5, 1989 [JP] Japan ................... 1-231165

[51] Int. Cl.$^5$ ............... G03F 7/023; G03F 7/32
[52] U.S. Cl. ..................... 430/191; 430/165; 430/192; 430/193; 430/326
[58] Field of Search ............... 430/191, 192, 193, 165, 430/326

[56] References Cited

U.S. PATENT DOCUMENTS

| | | | |
|---|---|---|---|
| 4,426,513 | 1/1984 | Mark | 528/204 |
| 4,599,413 | 7/1986 | Moulton et al. | 544/231 |
| 4,642,282 | 2/1987 | Stahlhofen | 430/192 |
| 4,719,167 | 1/1988 | Miura et al. | 430/192 |
| 4,725,523 | 2/1988 | Miura et al. | 430/192 |
| 4,797,346 | 1/1989 | Yamamoto et al. | 430/165 |
| 4,812,551 | 3/1989 | Oi et al. | 430/165 |
| 4,954,607 | 9/1990 | Otani et al. | 528/230 |
| 4,983,492 | 1/1991 | Trefonas, III et al. | 430/192 |
| 5,019,479 | 5/1991 | Oka et al. | 430/193 |
| 5,023,311 | 6/1991 | Kubota | 430/165 |

FOREIGN PATENT DOCUMENTS

63-261257  4/1988  Japan.

OTHER PUBLICATIONS

World Patent Index; Abstract: JP 63261267.

*Primary Examiner*—Charles L. Bowers, Jr.
*Assistant Examiner*—John S. Chu
*Attorney, Agent, or Firm*—Birch, Stewart, Kolasch & Birch

[57] ABSTRACT

A positive resist composition which comprises a 1,2-quinone diazide compound and an alkali-soluble resin containing a polyphenol compound (I) of the general formula:

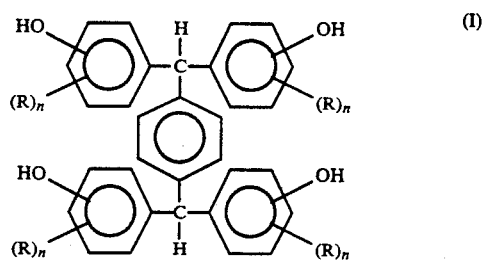

wherein R is a $C_1$–$C_5$ alkyl group or a $C_1$–$C_5$ alkoxy group, and n is a number of 0 to 3, which has good sensitivity, improved resolution and heat resistance.

5 Claims, No Drawings

RADIATION-SENSITIVE POSITIVE RESIST COMPOSITION COMPRISING AN O-QUINONE DIAZIDE, AN ALKALI-SOLUBLE RESIN AND A POLYPHENOL COMPOUND

This application is a continuation of application Ser. No. 07/574,112 filed on Aug. 29, 1990, now abandoned.

BACKGROUND OF THE INVENTION

Field of the Invention

The present invention relates to a resist composition which comprises a sensitizer and is sensitive to ultraviolet rays (G-line, H-line, I-line and so on), far ultraviolet rays (excimer laser and so on), electron rays, ion beam and radio-active rays, e.g. x rays.

Recently, particularly in the production of integrated circuits, miniaturization has proceeded as the integration level has increased, which results in demands for formation of patterns of submicron order and improved resolution. According to conventional processes for the production of integrated circuits, light exposure is accomplished by placing a mask in intimate contact to a substrate, e.g. a silicon wafer. It is said that this process cannot make patterns thinner than 2 μm. Instead of such conventional processes, the reduction projection exposure system attracts attention. According to this new system, a pattern of a master mask (reticle) is projected on the substrate with reduction by a lens system, whereby exposure is accomplished.

One of the serious problems in this system is low throughput. Namely, in this system, the total exposure time to expose a wafer is very long because of divided and repeated light exposure unlike a batch light exposure system which is employed in the conventional mask contact printing methods.

To solve this problem, not only an improvement in the apparatus but also an increase in sensitivity of the resist to be used are important. If the exposure time can be shortened by an increase in the sensitivity, the throughput and in turn the yield can be improved.

On the other hand, as the distance between the two adjacent lines is decreased with an increase in the integration level, dry etching is predominantly used rather than wet etching. The photoresist should have better heat resistance than ever.

When the positive photoresist now in practical use is checked from this standpoint, its sensitivity, resolution and heat resistance are not necessarily satisfactory. Generally, the positive photoresist has lower sensitivity than the negative photoresist and improvement in the sensitivity of the former is desired.

To increase the sensitivity, it is easiest to decrease a molecular weight of a novolak resin used in the positive photoresist. The decrease of the novolak resin molecular weight accelerates dissolution of the photoresist in an alkaline developing solution so that the apparent sensitivity of the photoresist is increased.

This method, however, has a very serious disadvantage that the heat resistance of the photoresist deteriorates. Moreover, it encounters some problems, e.g. large film thickness loss in an unexposed area (reduction of so-called film thickness retention), worsening a shape of the pattern, deterioration of the y-value because of small differences in the dissolving rates in the developing solution between the exposed area and the unexposed area.

In view of this, positive resists satisfying sensitivity, resolution and heat resistance at the same time have not been on the market up to now. Attempts to improve one of these three characteristics, leaves at least one of the remaining characteristics impaired.

SUMMARY OF THE INVENTION

One object of the present invention is to provide a positive resist composition which can overcome the above problems associated with the conventional positive resist compositions by the use of a polyphenol compound having a specific structure.

Another object of the present invention is to provide an alkali-soluble resin which comprises a polyphenol compound having the specific structure.

Accordingly, the present invention provides a positive resist composition which comprises a 1,2-quinone diazide compound and an alkali-soluble resin containing a polyphenol compound (I) of the general formula:

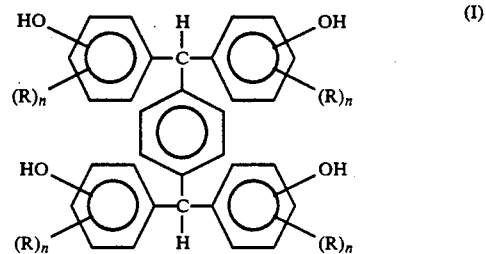

wherein R is a $C_1$–$C_5$ alkyl group or a $C_1$–$C_5$ alkoxy group, and n is a number of 0 to 3.

DETAILED DESCRIPTION OF THE INVENTION

Preferably, the R group is a $C_1$–$C_5$ alkyl group, a methoxy group and an ethoxy group.

Among the compounds (I), the following compound (II) of the formula:

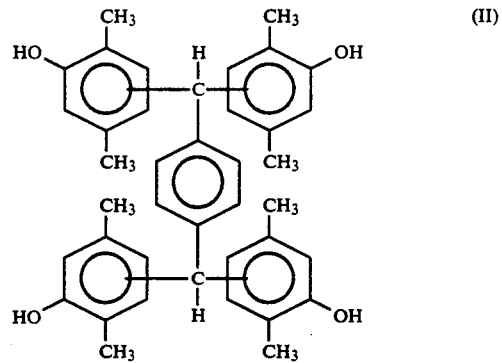

is preferably used.

The polyphenol compound (I) can be obtained by a condensation reaction of a phenol compound with terephtalaldehyde in the presence of an acid catalyst.

Examples of the phenol compound which is condensed with terephtalaldehyde include phenol, cresol, xylenol, 2,3,5-trimethylphenol, tert.-butylphenol, methoxyphenol, ethylphenol and so on.

Examples of the acid catalyst to be used in this condensation reaction include organic or inorganic acids (e.g. oxalic acid, p-toluenesulfonic acid, hydrochloric acid, sulfuric acid, etc.) and so on.

The amount of the phenol compound to be used in the condensation reaction is 4 to 80 moles, preferably 8 to 40 moles per mole of terephtalaldehyde.

The amount of the acid catalyst to be used in the condensation reaction is 0.01 to 0.7 mole per mole of terephtalaldehyde.

The condensation reaction may be carried out at a temperature of from 30° C. to 150° C. for from 1 to 30 hours.

The reaction may be carried out in the presence or absence of a solvent.

Suitable solvents include water, ethylcellosolve acetate, ethylcellosolve, methylcellosolve, methyl isobutyl ketone, methyl ethyl ketone, hexane, cyclohexane, heptane, benzene, toluene, and so on.

Among them, poor solvents to the raw materials (e.g. hexane, cyclohexane, heptane, toluene, etc.) are preferably used.

Preferably, the amount of the solvent is 10 to 700 parts by weight per 100 parts by weight of the total weight of the phenol compound and the carbonyl compound.

The compound (II) is prepared by reacting 2,5-xylenol with terephtalaldehyde.

The condensation reaction of 2,5-xylenol with terephtalaldehyde is preferably carried out in toluene in the presence of p-toluenesulfonic acid as the catalyst. The amount of toluene is 50 to 500 parts by weight per 100 parts by weight of 2,5-xylenol, the amount of 2,5-xylenol is 4 to 10 moles per mole of terephtalaldehyde, and the amount of p-toluenesulfonic acid is 0.01 to 0.1 mole, preferably 0.02 to 0.03 per mole of terephtalaldehyde.

This reaction may be carried out at a temperature of from 50° C. to a refluxing temperature for 5 to 30 hours.

After removing the metal ions, the condensation product can be purified by a suitable method such as recrystallization and reprecipitation.

One method for the removal of the metal ions is as follows:

The product is dissolved in an organic solvent which can be separated from a mixture with water and washed with ion-exchanged water. Examples of such an organic solvent include methyl isobutyl ketone, ethylcellosolve acetate, ethyl acetate and so on.

Another method for the removal of the metal ions is as follows:

The product is dissolved in an organic solvent which is not separated from a mixture with water, and charged into ion-exchanged water to precipitate the product. Examples of such an organic solvent include methanol, ethanol, acetone and so on. This method is preferred because the removal of the metal ions and the purification of the condensation product are done at the same time.

The positive resist composition of the present invention may contain at least one alkali-soluble resin other than the polyphenol compound (I). The amount of the polyphenol compound (I) is not less than 4 parts, preferably 10 to 40 parts by weight based on 100 parts by weight of the total amount of the alkali-soluble resin, namely the polyphenol compound (I) and the other alkali-soluble resin.

When the amount of the polyphenol compound (I) is 4 to 40 parts by weight, it is easy to develop the photoresist and make the pattern.

Preferred examples of the other alkali-soluble resins are polyvinylphenol, a novolak resin and so on. The novolak resin is prepared by an addition condensation reaction of a phenol compound with formaldehyde. Specific examples of the phenol compound used as one of the raw materials for the synthesis of the novolak resin include phenol, o-cresol, m-cresol, p-cresol, 2,5-xylenol, 3,5-xylenol, 3,4-xylenol, 2,3,5-trimethylphenol, 4-tert.-butylphenol, 2-tert.-butylphenol, 3-tert.-butylphenol, 3-ethylphenol, 2-ethylphenol 4-ethylphenol, 2-naphthol, 1,3-dihydroxynaphthalene, 1,7-dihydroxynaphthalene, 1,5-di-hydroxynaphthalene, etc. These phenols may be used alone or in combination.

The addition condensation reaction of the phenol with formaldehyde can be carried out according to a known method. This reaction is carried out at a temperature of from 60 to 120° C. for 2 to 30 hours. Organic acids, inorganic acids or divalent metal salts may be used as catalysts. Specific examples of the catalysts are oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in the presence or absence of a solvent.

Preferably, the novolak resin which is characterized in the following area ratio in a gel permeation chromatographic pattern (GPC pattern) measured by using a UV light (254 nm) detector is used:

An area ratio of a range in which the molecular weight as converted to polystyrene is not larger than 900 does not exceed 25%.

The novolak resin characterized as above is obtained through crystallization, fractionation, etc. For example, a synthesized novolak resin is dissolved in a good solvent, and water is poured in a resulting solution to precipitate the novolak resin. Alternatively, a synthesized novolak resin is poured into heptane, hexane, pentane, cyclohexane, etc. to fractionate it.

Examples of the good solvent are alcohols (e.g. methanol, ethanol, etc.), ketones (e.g. acetone, methyl ethyl ketone, methyl isobutyl ketone, etc.), ethyleneglycols and its ethers or ether esters (e.g. ethylcellosolve, ethylcellosolve acetate, etc.), tetrahydrofurane and so on.

The 1,2-quinone diazide compound to be used as a sensitizer in the positive resist composition of the present invention is not limited. Specific examples of the 1,2-quinone diazide compound are 1,2-benzoquinone diazide-4-sulfonic acid ester, 1,2-naphthoquinone diazide-4-sulfonic acid ester, 1,2-naphthquinone diazide-5-sulfonic acid ester, etc.

Above esters may be prepared by per se conventional methods. For example, the ester is prepared by a condensation reaction of a compound having a hydroxyl group with 1,2-naphthoquinone diazide sulfonyl chloride or benzoquinone diazide sulfonyl chloride in the presence of a weak alkali.

Examples of the compound having a hydroxyl group are hydroquinone, resorcinol, phloroglucin, 2,4-dihydroxybenzophenone, 2,3,4-trihydroxybenzophenone, 2,3,4,4'-tetrahydroxyben 2,2',4,4'-tetrahydroxybenzophenone, bis(p-hydroxyphenyl)methane, bis(2,4-dihydroxyphenyl)methane, bis(2,3,4-trihydroxyphenyl)methane, 2,2-bis(2,4-dihydroxyphenyl)propane, 2,2-bis(2,3,4-trihydroxyphenyl)-propane, hydroxyflavan compounds and the like. Among them, ester of 2,3,4,4'-tetrahydroxybenzophenone (at least two hydroxy groups on the average are esterified) or hydrofravan compounds (at least two hydroxy groups on the average are esterified) of the formula:

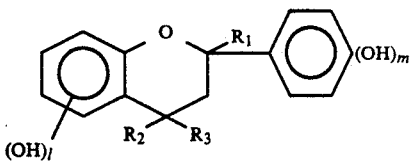

wherein l is a number of 0 to 4, m is a number of 1 to 5, and $R_1$, $R_2$ and $R_3$ are respectively a hydrogen atom, an alkyl group, an alkenyl group, a cyclohexyl group or an aryl group, with 1,2-naphthoquinonediazide-5-sulfonic acid are preferably used as 1,2-quinonediazide compound.

The positive resist composition of the present invention may contain two or more 1,2-quinonediazide compounds in combination.

The positive resist composition is prepared by mixing and dissolving the 1,2-quinonediazide compound and the alkali-soluble resin including the polyphenol (I) in a solvent.

The amount of the 1,2-quinonediazide compound is 5 to 100, preferably 10 to 50 parts by weight per 100 parts by weight of the alkali-soluble resin.

When the amount of the 1,2-quinonediazide compound is 5 to 100 parts by weight, it is easy to make the pattern, and the positive resist composition has excellent sensitivity.

Preferably, the used solvent evaporates at a suitable drying rate to give a uniform and smooth coating film. Such a solvent includes ethylcellosolve acetate, methylcellosolve acetate, ethylcellosolve, methylcellosolve, propyleneglycol monomethyl ether acetate, butyl acetate, methyl isobutyl ketone, xylene, etc.

To the positive photoresist composition obtained by the foregoing method, small amounts of resins, dyes, etc. may be added if desired.

The resist composition of the present invention has better sensitivity and also improved resolution and heat resistance in comparison with conventional ones.

PREFERRED EMBODIMENTS OF THE INVENTION

The present invention will be illustrated more in detail with the following Examples, but it is not limited to these Examples. In Examples, "parts" are by weight unless otherwise indicated.

SYNTHETIC EXAMPLE 1

Into a 500 ml three-necked flask equipped with a stirrer, a condenser, a water separator and a thermometer, 2,5-xylenol (97.74 g) terephtalaldehyde (10.73 g), p-toluenesulfonic acid (0.8 g) and toluene (195.5 g) were charged and stirred under reflux for 5 hours while removing condensed water. Then the resulting solution was cooled to room temperature and filtered to obtain a wet cake. The wet cake was washed three times with toluene (350 cc) and dried at a temperature of 60° C. to obtain a cake (45.2 g). Yield: 96.2%.

MS: m/e=586 (M+)

SYNTHETIC EXAMPLE 2

In a 1000 ml three-necked flask, were added m-cresol (149 g), p-cresol (121 g), ethylcellosolve acetate (252 g) and a 5 % aqueous solution of oxalic acid (30.4 g). Then, to the mixture, a 37.0 % formalin (147.8 g) was dropwise added over 40 minutes while heating and stirring under reflux. Thereafter, the reaction mixture was heated while stirring for a further 7 hours. After neutralization, washing with water and removing water, a solution of a novolak resin in ethylcellosolve acetate was obtained.

The weight average molecular weight measured by GPC was 9600 as converted to polystyrene.

SYNTHETIC EXAMPLE 3

The solution of novolak resin in ethylcellosolve acetate obtained in Synthetic Example 2 (the content of the novolak resin, 41.2%) (120 g) was added to a 3 liter separable flask, and then ethylcellosolve acetate (868.8 g) and n-heptane (544.6 g) were added. After stirring for 30 minutes at 20° C., the resulting mixture was left standing and separated. n-Heptane in the recovered lower layer was removed by an evaporator to obtain a novolak resin in ethyl cellosolve acetate.

The weight average molecular weight measured by GPC was 15500 as converted to polystyrene. Through the separation operation, 75% of the lower molecular weight fractions were removed. An area ratio in GPC of a range in which the molecular weight as converted to polystyrene is not larger than 900 was 7%.

EXAMPLES 1 AND 2

Each of the compounds obtained in Synthetic Example 1 and the novolak resins obtained in Synthetic Example 2-3 was dissolved together with a sensitizer in ethylcellosolve acetate in amounts in Table to prepare a resist solution. The amount of the solvent was adjusted to form a film having a thickness of 1.28 μm when the resist solution was applied under the coating conditions below.

Each composition was filtered through a Teflon (trade mark) filter of 0.2 μm in pore size to prepare a resist solution. The solution was then coated on a silicon wafer, which had been rinsed in a usual manner, by means of a spinner at 4000 rpm. The coated silicon wafer was baked for one minute on a vacuum adsorption-type hot plate kept at 100° C. and exposed to light the exposure time of which was varied stepwise at each shot by means of a reduction projection exposure apparatus with an extra-high-pressure mercury lamp as alight source. Thereafter, the silicon wafer was developed in a developing solution (SOPD (trade name) manufactured by Sumitomo Chemical Company, Limited) to obtain a positive pattern. After rinsing and drying, the amount of film thickness loss for each shot was plotted against the exposure time to calculate sensitivity. The film thickness retention was calculated from the remaining film thickness in the unexposed area. Also, the silicon wafer having a resist pattern was placed for 30 minutes in a clean oven set at various temperatures in the air, and the heat resistance was evaluated by observing the resist pattern by means of a scanning electron microscope.

COMPARATIVE EXAMPLE 1 AND 2

The same procedures as in Example 1 were repeated except that the novolak resins was dissolved together with a sensitizer in ethylcellosolve acetate in amounts in Table to prepare a resist solution. Sensitivity and the film thickness retention are calculated and the heat resistance is evaluated in the same manner as in Example 1.

These results are collectively shown in Table.

It is seen from the results in Table that balance between the sensitivity and heat resistance in the Examples is markedly improved in comparison with the Comparative Examples.

TABLE

|  | Example No. | | Comp. Ex. No. | |
|---|---|---|---|---|
|  | 1 | 2 | 1 | 2 |
| Amount of polyphenol (parts) | 4.0 | 4.0 | — | — |
| Kind of polyphenol (Synthetic Example No.) | 1 | 1 | — | — |
| Amount of cresol novolak resin (parts) | 13 | 13 | 17 | 17 |
| Kind of cresol novolak resin (Synthetic Example No.) | 2 | 3 | 2 | 3 |
| Sensitizer: | | | | |
| Kind*[1] | (1) | (1) | (1) | (1) |
| Amount (parts) | 4.5 | 4.5 | 4.5 | 4.5 |
| Sensitivity (msec) | 140 | 250 | 85 | >800 |
| Film thickness retention (%) | 94.0 | 99.1 | 77.2 | 99.8 |
| Heat resistance*[2] °C. | 130 | 160 | 140 | 160 |
| Resolution*[3] (μm) | 0.9 | 0.7 | 0.9 | 1.0 |

Note:
*[1] A condensation product of naphthoquinone-(1,2)-diazide-(2)-5-sulfonyl chloride with 2,3,4,4'-tetrahydroxybenzophenone.
*[2] The temperature in the clean over at which the resist pattern begins to soften and flow.
*[3] The minimum line width where the lines and spaces are resolved.

What is claimed is:

1. A positive resist composition comprising, in admixture, a 1,2-quinone-diazide compound, a novolak resin prepared by an addition condensation reaction of a phenol compound with formaldehyde, and a polyphenol compound (I) of the formula:

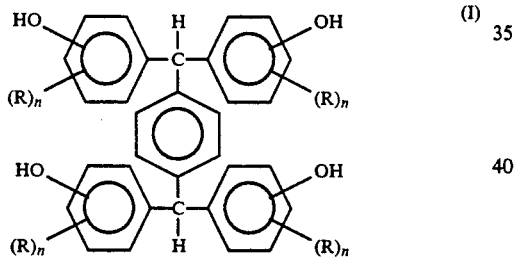

wherein R is a $C_1$–$C_5$ alkyl group or a $C_1$–$C_5$ alkoxy group, and n is a number of 0 to 3, wherein said 1,2-quinone diazide compound is prepared by a condensation reaction of 1,2-naphthoquinone diazide sulfonyl chloride or benzoquinone diazide sulfonyl chloride with at least one compound having a hydroxyl group selected from the group consisting of hydroquinone, resorcinol, phloroglucin, 2,4-dihydroxybenzophenone, 2,3,4-trihydroxybenzophenone, 2,3,4,4'-tetrahydroxybenzophenone, 2,2', 4,4'-tetrahydroxy-benzophenone, bis(p-hydroxyphenyl)methane, bis(2,4-dihydroxyphenyl)methane, bis(2,3,4-trihydroxyphenyl)methane, 2,2-bis(2,4-dihydroxyphenyl)propane, 2,2-bis(2,3,4-trihydroxyphenyl)propane and hydroxyflavan compounds.

2. The positive resist compound composition according to claim 1, wherein the polyphenol compound (I) is a compound of the formula:

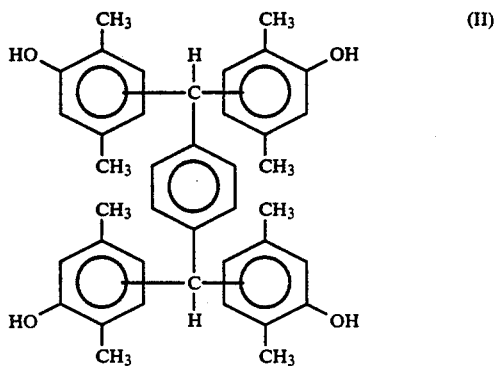

3. The positive resist compound composition according to claim 1 or 2, wherein the content of the polyphenol compound (I) is 4 to 40 parts by weight per 100 parts of a total of the novolak resin and the polyphenol compound (I).

4. The positive resist composition according to claim 1, wherein the alkali-soluble resin is characterized in that an area ratio in GPC of a range in which the molecular weight as converted to polystyrene is not larger than 900 does not exceed 25%.

5. The positive resist composition according to claim 1, wherein said 1,2-quinone diazide compound is prepared by a condensation reaction of 2,3,4,4'-tetrahydroxybenzophenone or hydroxyflavan compounds of the formula:

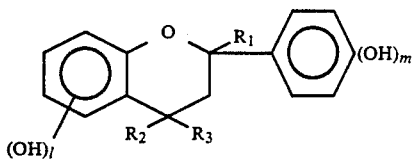

wherein l is a number of 0 to 4, m is a number of 1 to 5, and $R_1$, $R_2$ and $R_3$ are respectively a hydrogen atom or a $C_1$–$C_5$ alkyl group, with 1,2-naphthoquiononediazide-5-sulfonic acid.

* * * * *